United States Patent
Chainer et al.

(10) Patent No.: US 10,082,849 B2
(45) Date of Patent: Sep. 25, 2018

(54) OPTIMIZING COOLING ENERGY FOR A RECONFIGURABLE COMPUTER SYSTEM

(71) Applicant: International Business Machines Corporation, Armonk, NY (US)

(72) Inventors: Timothy J. Chainer, Putnam Valley, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 14/953,277

(22) Filed: Nov. 27, 2015

(65) Prior Publication Data

US 2016/0349811 A1  Dec. 1, 2016

Related U.S. Application Data

(63) Continuation of application No. 14/727,483, filed on Jun. 1, 2015.

(51) Int. Cl.
  *G06F 1/20*   (2006.01)
  *H05K 7/20*   (2006.01)
  *G05B 15/02*  (2006.01)

(52) U.S. Cl.
  CPC .............. *G06F 1/206* (2013.01); *G05B 15/02* (2013.01); *H05K 7/20709* (2013.01);
  (Continued)

(58) Field of Classification Search
  CPC .... G06F 1/206; G05B 15/02; H05K 7/20709; H05K 7/20718; H05K 7/20754; H05K 7/20836
  See application file for complete search history.

(56) References Cited

U.S. PATENT DOCUMENTS 4,047,242 A   9/1977 Jakob et al.
6,101,459 A * 8/2000 Tavallaei ........... H05K 7/20836
                                                    702/130

(Continued)

FOREIGN PATENT DOCUMENTS

JP           5210280          6/2013

OTHER PUBLICATIONS

Cisco, Cisco White Paper "Deliver Fabric-Based Infrastructure for Virtualization and Cloud Computing," Cisco White Paper C11-706418-00, May 2012, pp. 1-10.

(Continued)

*Primary Examiner* — Michael Jung
(74) *Attorney, Agent, or Firm* — L. Jeffrey Kelly, Esq.; Otterstedt, Ellenbogen & Kammer, LLP

(57) ABSTRACT

A computing system includes a first pool of collocated high heat density computing components; a second pool of collocated low heat density computing components; and a reconfigurable switching fabric electrically interconnecting the pools. A first cooling structure is in thermal communication with the first pool; a second cooling structure is in thermal communication with the second pool; and at least one heat rejection unit is in thermal communication with the first cooling structure, the second cooling structure, and at least one heat sink. A controller is configured to obtain a specification of a computing workload; electrically configure at least a portion of the first pool and at least a portion of the second pool to handle the computing workload, by reconfiguring the switching fabric; and select operating parameters for the first and second cooling structures and the at least one heat rejection unit to handle the computing workload.

3 Claims, 11 Drawing Sheets

(52) U.S. Cl.
CPC ..... *H05K 7/20718* (2013.01); *H05K 7/20754* (2013.01); *H05K 7/20836* (2013.01); *Y02D 10/16* (2018.01)

(56) References Cited

U.S. PATENT DOCUMENTS

| | | |
|---|---|---|
| 6,597,569 B1 | 7/2003 | Unrein |
| 7,287,581 B2 | 10/2007 | Ziehr |
| 7,667,967 B1 | 2/2010 | Copeland |
| 7,920,381 B2 | 4/2011 | Kitahara |
| 2006/0248325 A1 | 11/2006 | Fung |
| 2013/0205822 A1 | 8/2013 | Heiland et al. |
| 2013/0264045 A1 | 10/2013 | Chainer et al. |
| 2014/0025223 A1* | 1/2014 | Chinnakkonda ........ G06F 1/206 700/300 |
| 2014/0114496 A1* | 4/2014 | Berry ................ H05K 7/20836 700/299 |
| 2014/0362521 A1* | 12/2014 | Pronozuk ........... H05K 7/20836 361/679.47 |
| 2015/0005949 A1* | 1/2015 | Haridass ................ G06F 1/206 700/275 |
| 2015/0057828 A1* | 2/2015 | Civilini ................ G05B 13/048 700/299 |
| 2015/0185794 A1* | 7/2015 | Garden ................... G06F 1/206 713/323 |

OTHER PUBLICATIONS

George J. Weiss and Andrew Butler, "Fabric Computing Poised as a Preferred Infrastructure for Virtualization and Cloud Computing," Gartner Research paper ID No. G00210438, Feb. 11, 2011, pp. 1-6.

Timothy J. Chainer et al., unpublished U.S. Appl. No. 14/727,483, filed Jun. 1, 2015 "Optimizing Cooling Energy," pp. 1-35 plus 11 sheets drawings.

List of IBM Patents or Applications Treated As Related.

* cited by examiner

OPTIMIZING COOLING ENERGY FOR A RECONFIGURABLE COMPUTER SYSTEM

CROSS-REFERENCE TO RELATED APPLICATION

This application is a continuation of U.S. patent application Ser. No. 14/727,483 filed Jun. 1, 2015, the complete disclosure of which is expressly incorporated herein by reference in its entirety for all purposes.

FIELD OF THE INVENTION

The present invention relates to thermal control of electronics, and, more particularly, to optimizing cooling energy consumed in data centers, and the like.

BACKGROUND OF THE INVENTION

Data centers are facilities that house numerous computer systems arranged in the form of electronics racks. Typically, a data center houses on the order of a few thousand electronic racks. Each computer system in a rack may include one or more processors, memory devices, controllers, power converters and manipulators, and other such electronic components, which perform different operations and dissipate varying amounts of heat. Moreover, depending upon the state of operation, a computer system may dissipate on the order of few hundred Watts to a few thousand Watts. Therefore, a significant amount of cooling is required to keep the electronic components within an optimum operating temperature range (typically, 75° C.-85° C.). According to the 2007 Report to Congress on Server and Data Center Energy Efficiency, in 2005, server driven power usage amounted to 1.2% of total US energy consumption. Over the past six years, energy use by these centers and their supporting infrastructure is estimated to have increased by nearly 100 percent (US DoE Information and Communications Technology Roadmap). Recent studies have shown the cooling energy to be 25%-40% of the total data center energy.

Conventional computer systems are designed so as to have the micro-processors, the memory modules, and the hard drives in close proximity. As each electronic component dissipates a different amount of heat, and the different components are present in close proximity to each other, the cooling solution is generally designed to cool the limiting component.

SUMMARY OF THE INVENTION

Principles of the invention provide techniques for optimizing cooling energy. In one aspect, an exemplary system includes a reconfigurable computing system, which in turn includes a first pool of collocated high heat density computing components; a second pool of collocated low heat density computing components, of a different type than the first pool of collocated high heat density computing components, and spaced apart from the first pool of collocated high heat density computing components. The reconfigurable computing system also includes a reconfigurable switching fabric electrically interconnecting the first pool of collocated high heat density computing components and the second pool of collocated low heat density computing components. The exemplary system also includes a first cooling structure in thermal communication with the first pool of collocated high heat density computing components; a second cooling structure in thermal communication with the second pool of collocated low heat density computing components; at least one heat rejection unit in thermal communication with the first cooling structure, the second cooling structure, and at least one heat sink; and a controller coupled to the reconfigurable computing system, the first and second cooling structures, and the at least one heat rejection unit. The controller is configured to obtain a specification of a computing workload; electrically configure at least a portion of the first pool of collocated high heat density computing components and at least a portion of the second pool of collocated low heat density computing components to handle the computing workload, by reconfiguring the switching fabric; and select operating parameters for the first and second cooling structures and the at least one heat rejection unit to handle the computing workload.

In another aspect, an exemplary method is provided for thermally controlling a reconfigurable computing system having a first pool of collocated high heat density computing components, a second pool of collocated low heat density computing components, of a different type than the first pool of collocated high heat density computing components, and spaced apart from the first pool of collocated high heat density computing components, and a reconfigurable switching fabric electrically interconnecting the first pool of collocated high heat density computing components and the second pool of collocated low heat density computing components. The method includes the steps of: obtaining a specification of a computing workload; electrically configuring at least a portion of the first pool of collocated high heat density computing components and at least a portion of the second pool of collocated low heat density computing components to handle the computing workload, by reconfiguring the switching fabric; and selecting operating parameters for a first cooling structure in thermal communication with the first pool of collocated high heat density computing components; a second cooling structure in thermal communication with the second pool of collocated low heat density computing components; and at least one heat rejection unit in thermal communication with the first cooling structure, the second cooling structure, and at least one heat sink; to handle the computing workload.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects; for example, the flexible architecture provides savings in operation and acquisition costs compared to the current mode of operation. There are savings due to the significant decrease in complexity since fewer components (including networking, computing, cabling, adjuncts, and overlay software) are required. Savings also come due to the elimination in costs associated with delivering a given workload (due to higher efficiencies and utilizations), providing application high availability, footprint reduction, reconfiguration, power reduction, and the like. This Fabric Computing framework enables new subsystem packaging where CPU, memory, disk drives, etc. can be configured in "pools" rather than close proximity. This provides a path to increasing data center cooling and/or power energy efficiency where cooling solutions can be designed for sub-component power density. Moreover, dynamic configuration can provide provisioning of cooling and power.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
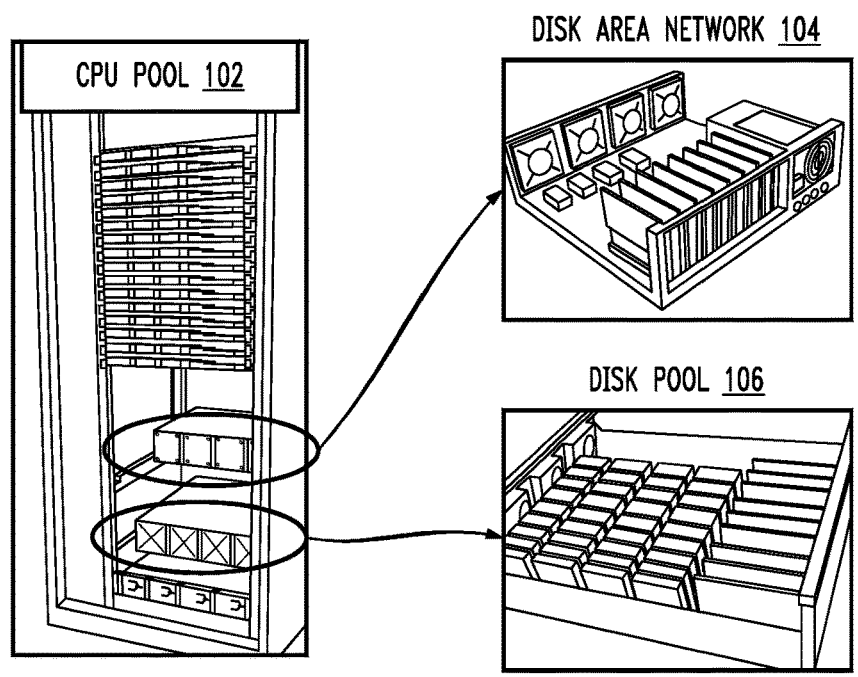
FIGS. 1-3 show an optical component switch fabric computing subsystem packaging to connect and dynamically reconfigure systems at sub-component level.

As noted, data centers are facilities that house numerous computer systems arranged in the form of electronics racks. Typically, a data center houses on the order of a few thousand electronic racks. Each computer system in a rack may include one or more processors, memory devices, controllers, power converters and manipulators, and other such electronic components, which perform different operations and dissipate varying amounts of heat. Moreover, depending upon the state of operation, a computer system may dissipate on the order of few hundred Watts to a few thousand Watts. Therefore, a significant amount of cooling is required to keep the electronic components within an optimum operating temperature range (typically, 75° C.-85° C.). According to the 2007 Report to Congress on Server and Data Center Energy Efficiency, in 2005, server driven power usage amounted to 1.2% of total US energy consumption. Over the past six years, energy use by these centers and their supporting infrastructure is estimated to have increased by nearly 100 percent (US DoE Information and Communications Technology Roadmap). Recent studies have shown the cooling energy to be 25%-40% of the total data center energy. In the face of growing global energy demand, uncertain energy supplies, and volatile energy prices, one or more embodiments advantageously provide innovative solutions to significantly advance the energy efficiency of these data center systems.

Conventional computer systems are designed so as to have the micro-processors, the memory modules, and the hard-drives in close proximity. As each electronic component dissipates a different amount of heat, and the components are present in close proximity to each other, the cooling solution is generally designed to cool the limiting component. This causes the non-limiting components to be over-cooled at any given time leading to inefficient cooling.

One or more embodiments make use of optical component switches (OCS). With OCS, the close proximity of the majority of dissimilar components is not needed. The OCS approach enables a high-speed "fabric" to connect and dynamically reconfigure systems at the sub-component level.

One or more embodiments employ a fabric computing approach, which enables new subsystem packaging where the CPU, memory, and disk can be configured in "pools" rather than in close proximity to each other. This provides a path to increasing data center cooling and/or power energy efficiency by one or more of:

Allowing cooling solutions to be designed for sub-component power density;

Allowing for dynamic configuration, which can provide provisioning of cooling and power.

One or more embodiments provide cooling solutions that can be designed for sub-component power density, with dynamic configuration that can provide provisioning of cooling and power. One or more embodiments provide a method of optimizing cooling energy by pooling computer sub-systems based on their power densities. Additionally, by pooling the computational sub-systems and/or components, the voltage regulation and manipulation can be better optimized to deliver like voltages to similar sub-system components.

A fabric computing architecture (FCA) is a converged system that combines computing, networking, and input/output (JO). It has the potential to become the next generation architecture for enterprise servers based on the benefits it can deliver. Gartner has listed fabric computing as one of its top 10 technologies for 2008. The architecture solves fundamental issues in the data center today, including asset under-utilization, management complexity, inflexibility, and spiraling operating costs.

A fabric computing architecture provides reconfigurable pools of computing, communications and storage resources connected to a highly available, high performance, scalable communications fabric. The fabric computing architecture provides pools of standard processors, memory, networking, storage and IO which can be assembled into logical building blocks including a virtual local area network (VLAN), storage area network (SAN), IDS (Intrusion Detection System), load balancing, firewall, virtual private network (VPN), router, IO gateways, and servers. These building blocks can be assembled in real time to deliver the complete infrastructure to support any application.

The flexible architecture provides savings in operation and acquisition costs compared to the current mode of operation. There are savings due to the significant decrease in complexity since fewer components (including networking, computing, cabling, adjuncts, and overlay software) are required. Savings also come about due to the elimination in costs associated with delivering a given workload (due to higher efficiencies and utilizations), providing application high availability, footprint reduction, reconfiguration, power reduction, and the like.

Figure 2:
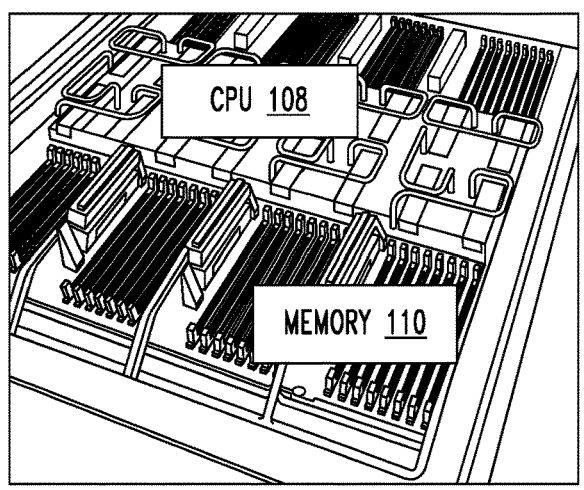
Figure 3:
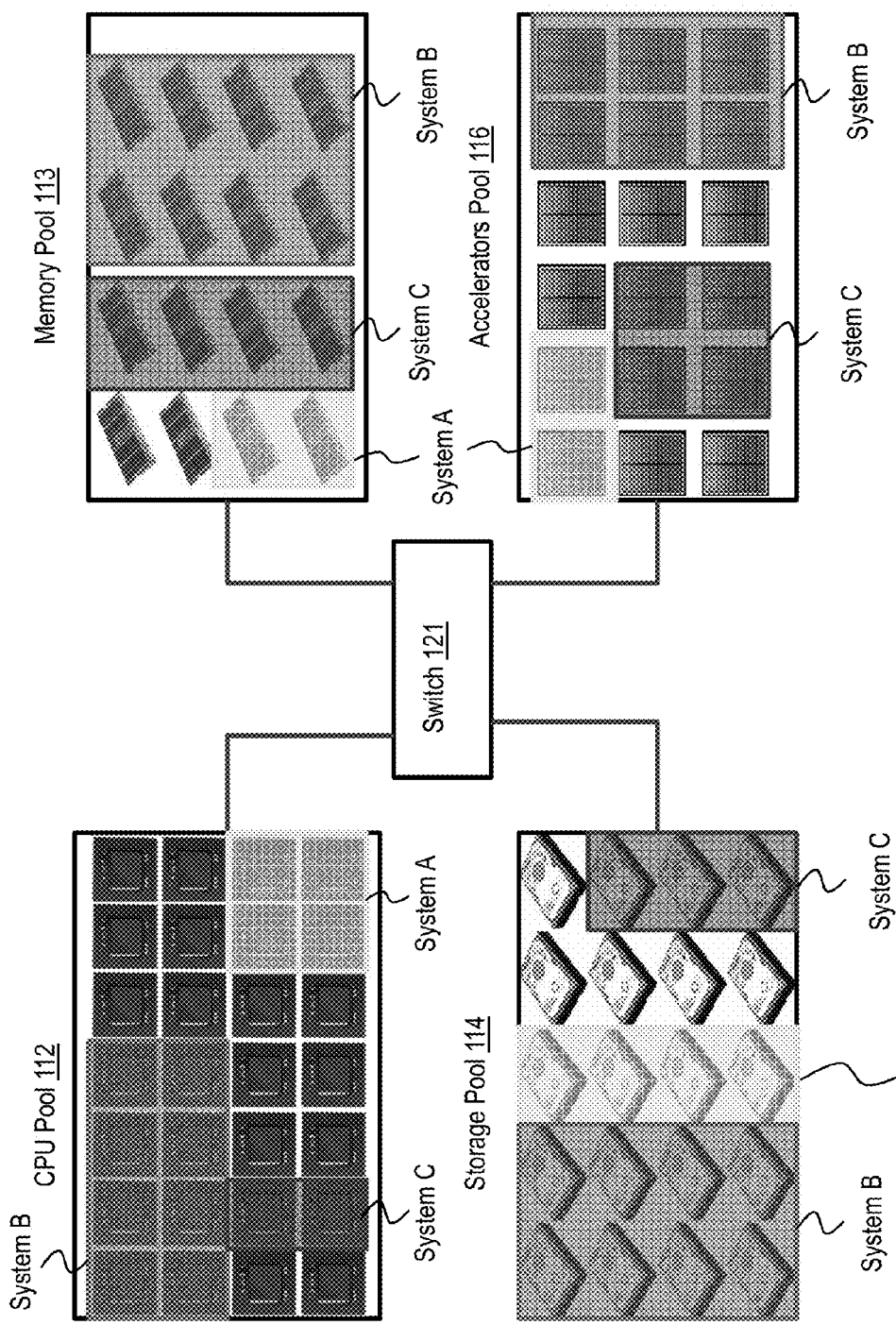

FIGS. 1-3 show optical component switch fabric computing subsystem packaging to connect and dynamically reconfigure systems at the sub-component level. This fabric computing framework enables new subsystem packaging where CPU, memory, disk drives, etc., can be configured in "pools" rather than in close proximity. This provides a path to increasing data center cooling and/or power energy efficiency where cooling solutions can be designed for sub-component power density. Moreover, dynamic configuration can provide provisioning of cooling and power. FIG. 1 shows hardware configuration in pools; namely, CPU pool 102, disk area network pool 104, and disk pool 106. FIG. 2 shows an IBM POWER7-IH supercomputer with a memory pool 110 and another instance of a CPU pool 108. The computer shown in FIG. 2 is a non-limiting example of a liquid cooled server or other liquid cooled computer.

FIG. 3 shows aspects of dynamic system configuration. A CPU pool 112, a memory pool 113, a storage pool 114, and an accelerators pool 116 are dynamically configured to provide System A 117, System B 118, and System C 120. Advantageously, this provides high utilization, high performance, and serviceability. Optical component switch 121 enables a high-speed "fabric" to connect and dynamically reconfigure systems at the sub-component level. Fabric computing enables new subsystem packaging—CPU, memory, disk can be configured in "pools" rather than close proximity.

Figure 4:
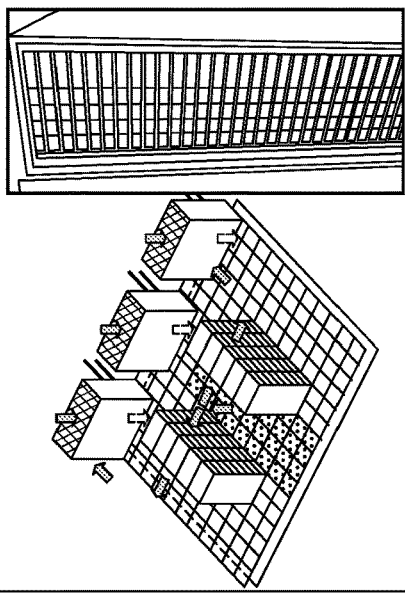
FIG. 4 shows additional aspects of optical component switch fabric computing subsystem packaging.
Figure 4:
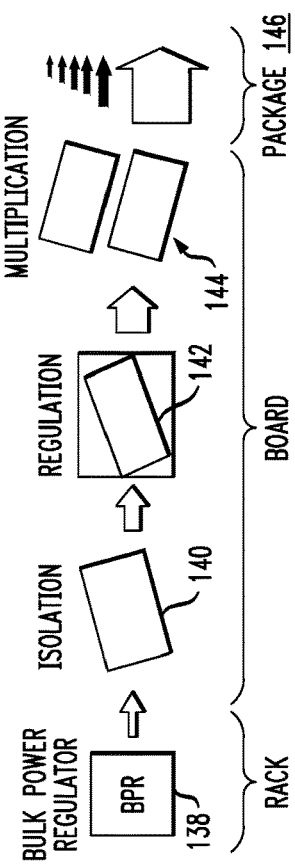
Figure 4:
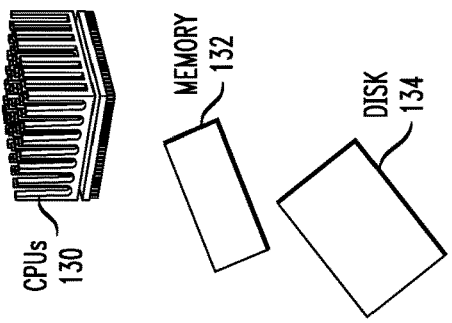
Figure 4:
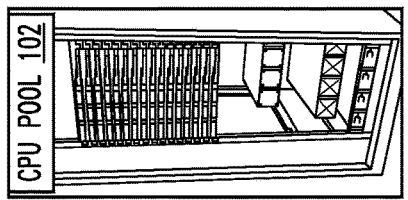
Figure 4:
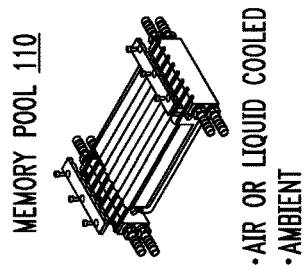

FIG. 4 shows additional aspects pertinent to optical component switch fabric computing subsystem packaging. To set the context, at 128, note a typical air cooled data center layout where refrigerated air is provided to all the electronic components having varied heat densities. These conventional computer systems are designed so as to have the micro-processors, the memory modules, and the hard-drives in close proximity. As each electronic component dissipates a different amount of heat and they are present in close proximity to each other, the cooling solution is generally designed to cool the limiting component. This causes the non-limiting components to be over-cooled at any given time leading to inefficient cooling. As seen at 130, 132, 134, CPUs may dissipate 50-100 W/cm$^2$; memory may dissipate about 1 W/cm$^2$; and a disk may dissipate about 10 W total.

As seen at 136, again to set the context, in conventional computer systems, various stages of voltage regulation are required to address varying voltage requirements of sub-components, leading to power losses in voltage conversion. Bulk power regulator 138 may provide 350 VDC to bus converter module 140, which in turn supplies 44 V to board-level voltage regulator 142. Board-level voltage regulator 142 in turn supplies 40 V to current multiplier 144; finally, at the package level 146, voltages of less than 1 V may be appropriate.

Both the above energy inefficiency issues 128, 136 can be addressed by implementing optical component switch fabric computing subsystem packaging as seen at 148, where cooling solutions can be designed for sub-component power density. In the non-limiting example shown, CPU pool 102 can be liquid cooled, refrigerated, or ambient air cooled; memory pool 110 can be air or liquid cooled or ambient cooled; and disk pool 106 and be air cooled or ambient cooled.

It should be noted that those skilled in the computing arts will be familiar with the concept of fabric computing from, for example, George J. Weiss and Andrew Butler, "Fabric Computing Poised as a Preferred Infrastructure for Virtualization and Cloud Computing," Gartner Research paper ID Number: G00210438, 11 Feb. 2011, expressly incorporated by reference herein in its entirety for all purposes, and the Cisco White Paper "Deliver Fabric-Based Infrastructure for Virtualization and Cloud Computing," Cisco White Paper C11-706418-00, May 2012, also expressly incorporated by reference herein in its entirety for all purposes.

Figure 5:
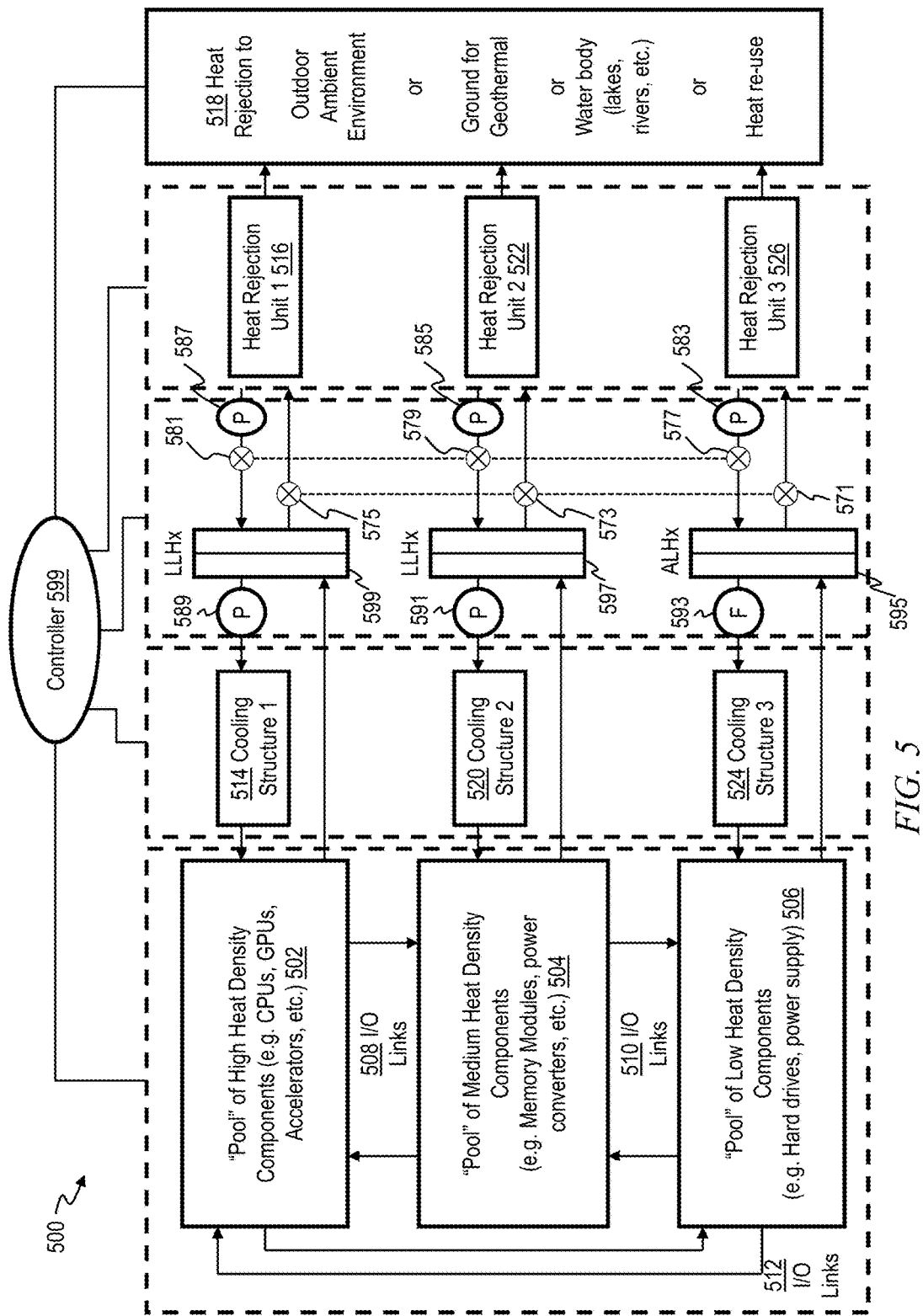
FIG. 5 shows computing system packaging, according to an aspect of the invention.

FIG. 5 shows the system level packaging 500 for the optical component switch fabric computing system, wherein the computational sub-systems are "pooled" based on their heat densities—high heat density components 502 such as micro-processors; medium heat density components 504 such as memory modules, power converters, graphics cards, etc.; and low heat density components 506 such as disk drives, power supply, etc. In one or more embodiments, each of these "pools" of computation resources is connected with high speed inter-connects and IO links 508, 510, 512 to enable high computational efficiency. Moreover, the pooled resources can, in one or more instances, be confined in a space of the size of either a 1U (standard compute rack measurement unit, 1 U=1.75 inches (4.445 cm) high) server or a standard information technology (IT) rack or a data center. In the example, the high heat density components 502 are connected to a first cooling structure 514 which in turn is connected to its corresponding first primary heat rejection unit 516, which rejects the heat to an appropriate heat sink 518 (e.g., outdoor ambient air, ground, body of water, or as heat input to another process in a heat re-use case).

Similarly, the medium heat density components 504 are connected to a second cooling structure 520 which in turn is connected to its corresponding second primary heat rejection unit 522, which also rejects the heat to the appropriate heat sink 518. Furthermore, the low heat density components 506 are connected to a third cooling structure 524 which in turn is connected to its corresponding third primary heat rejection unit 526, which also rejects the heat to the appropriate heat sink 518. Each of the heat rejection units 516, 522, 526 could be a dry cooler, a wet cooler, building chilled water, a cooling tower, geothermal cooling, building heating and/or heat recovery units, water conditioning units, or the like. Each of the cooling structures 514, 520, 524 can connect to primary heat rejection units of other cooling structures. For example, the first cooling structure 514 can be connected to first heat rejection unit 516 as well as second heat rejection unit 522 and/or third heat rejection unit 526, either in series or in parallel, to attain higher cooling in case additional cooling is required. Note that each cooling structure 514, 520, 524 could be, for example, a liquid cooling structure, an immersion cooling structure, an air cooling structure, refrigeration-based cooling structure, or the like. The option to connect cooling structures 514, 520, 524 to alternative heat rejection units is provided by valves 571, 573, 575, 577, 579, 581.

Figure 9:
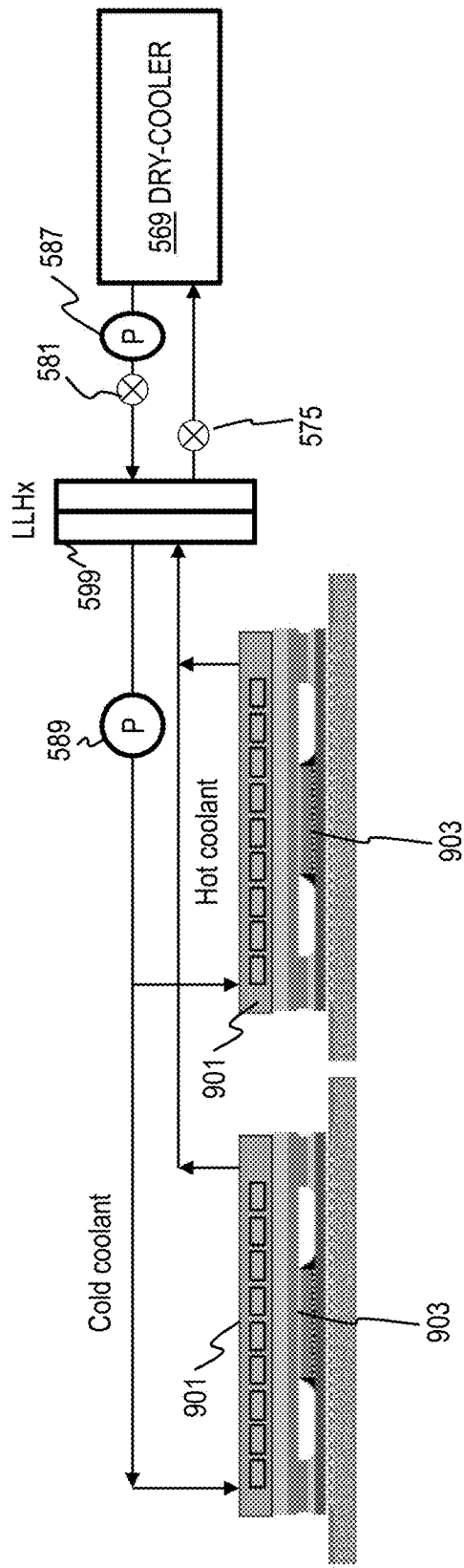
FIGS. 9 and 10 show exemplary cooling structures.

By way of example and not limitation, and referring now to FIG. 9, cooling structure 1, numbered 514, could be a cold plate 901 attached to a processor 903 through a thermal interface material; for example, a brazed cold plate with liquid cooling attached to a microprocessor (exemplary high-heat component) through a thermal interface. Furthermore, also by way of example and not limitation, the medium heat component 504 could be a standard memory DIM (dual in-line module), and cooling structure 2, numbered 520, could be a metal (e.g., copper) heat spreader which is attached to the medium heat component 504. The heat spreader is then thermally contacted to a liquid-cooled cold rail. Even further, and again, by way of example and not limitation, referring now to FIG. 10, the low heat density component 506 could be a hard disk drive 1099 (optionally in an air-cooled metal enclosure), voltage regulator 1097, or similar type of component, while cooling structure 3 numbered 524 could include a heat sink 1095 with fins exposed to air flow from a fan or fans 1093.

Heat rejection unit 1, numbered 516, could be, for example, a chilled water supply (chilled water cooled by a mechanical refrigeration cycle; heat ultimately rejected to outdoor ambient) which absorbs heat from cooling structure 1, numbered 514, via a liquid-to-liquid heat exchanger (LLHX) 599. For example, a "clean" non-corrosive coolant is run through the cooling structure 1, numbered 514, by pump 589, and exchanges heat with the chilled water from heat rejection unit 1, numbered 516, in LLHX 599. Pump 587 circulates the chilled water. In another example, shown in FIG. 9, heat rejection unit 1, numbered 516, is a dry-cooler 569.

Heat rejection unit 2, numbered 522, could be, for example, a non-chilled (e.g., outdoor ambient) water supply which absorbs heat from cooling structure 2, numbered 520, through a liquid-to-liquid heat exchanger (LLHX) 597. For example, a "clean" non-corrosive coolant is run through the cooling structure 2, numbered 520 (e.g., liquid-cooled cold rail portion) by pump 591, and exchanges heat with the non-chilled water of heat rejection unit 2, numbered 522, in LLHX 597. The non-chilled water can be run (by pump 585) to an outdoor air-to-liquid heat exchanger, with a fan, where it rejects heat to the ambient air. The outdoor air-to-liquid heat exchanger could be, for example, a wet cooler wherein water is blown on (like a cooling tower) to obtain evaporative cooling/wet bulb temperature).

Figure 10:
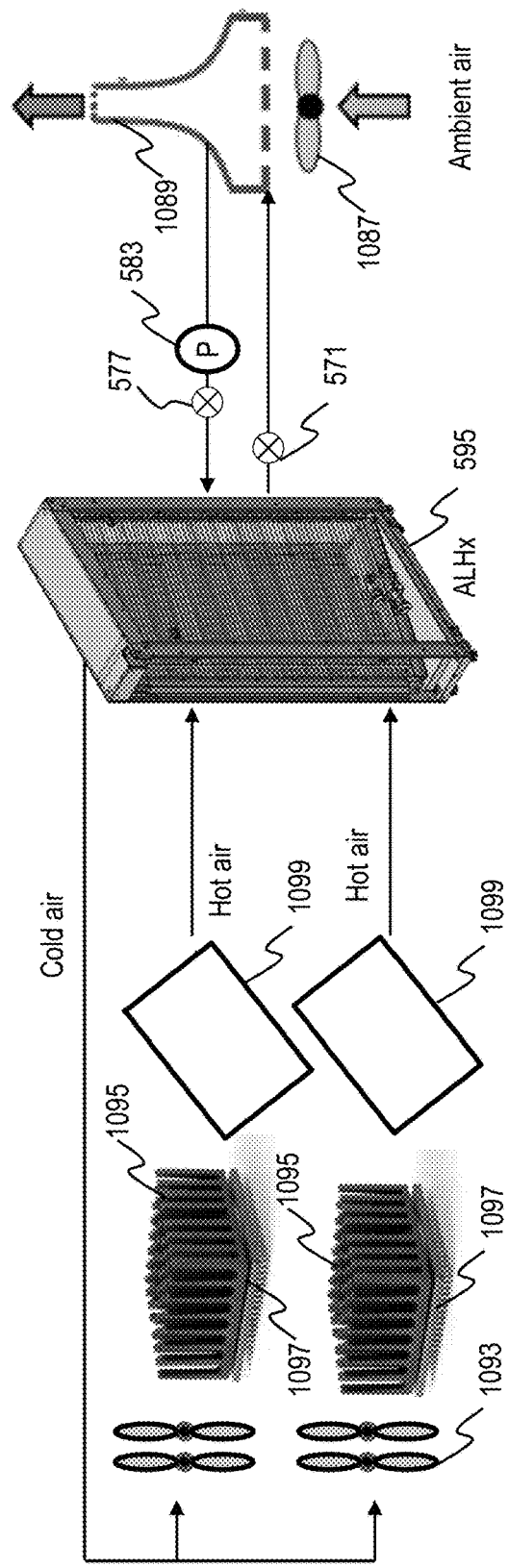

As noted above, low heat density component 506 could be a hard disk drive 1099, voltage regulator 1097, or similar type of component, while cooling structure 3 numbered 524 could include a heat sink 1095 with fins exposed to air flow from a fan or fans 1093. A so-called side car radiator can also be included, where the air that is blown around the rack and over the heat sink fins by the fan is cooled by an air-to-liquid (e.g., rack cooling air to working fluid in a mechanical refrigeration cycle or ambient water) or air-to-air heat exchanger (e.g., rack cooling air to outdoor air). Heat rejection unit 3, numbered 524, could be, for example, as seen in FIG. 10, an outdoor air-to-liquid heat exchanger (such as cooling tower 1089), with a fan 1087, which rejects heat from the liquid to the ambient air. The outdoor air-to-liquid heat exchanger could be, for example, a dry cooler wherein evaporative cooling is not used. For example, air is circulated by a fan 593, 1093; it blows over the heat sink fins on the heat sink 1095 in thermal communication with the hard drive or voltage regulator, and in turn is cooled in the side car (air to liquid heat exchanger or ALHX) 595 by the liquid (pumped by pump 583) that is in turn cooled in heat rejection unit 3, numbered 526.

Not all heat is necessarily rejected to the same heat sink—as noted, heat sink 518 could include one, some, or all of outdoor ambient air, ground, body of water, or heat input to another process in a heat re-use case. In other embodiments, elements such as 524 and 526 could connect via an air-to-air heat exchanger directly to outdoor ambient air or geothermal the like.

Figure 6:
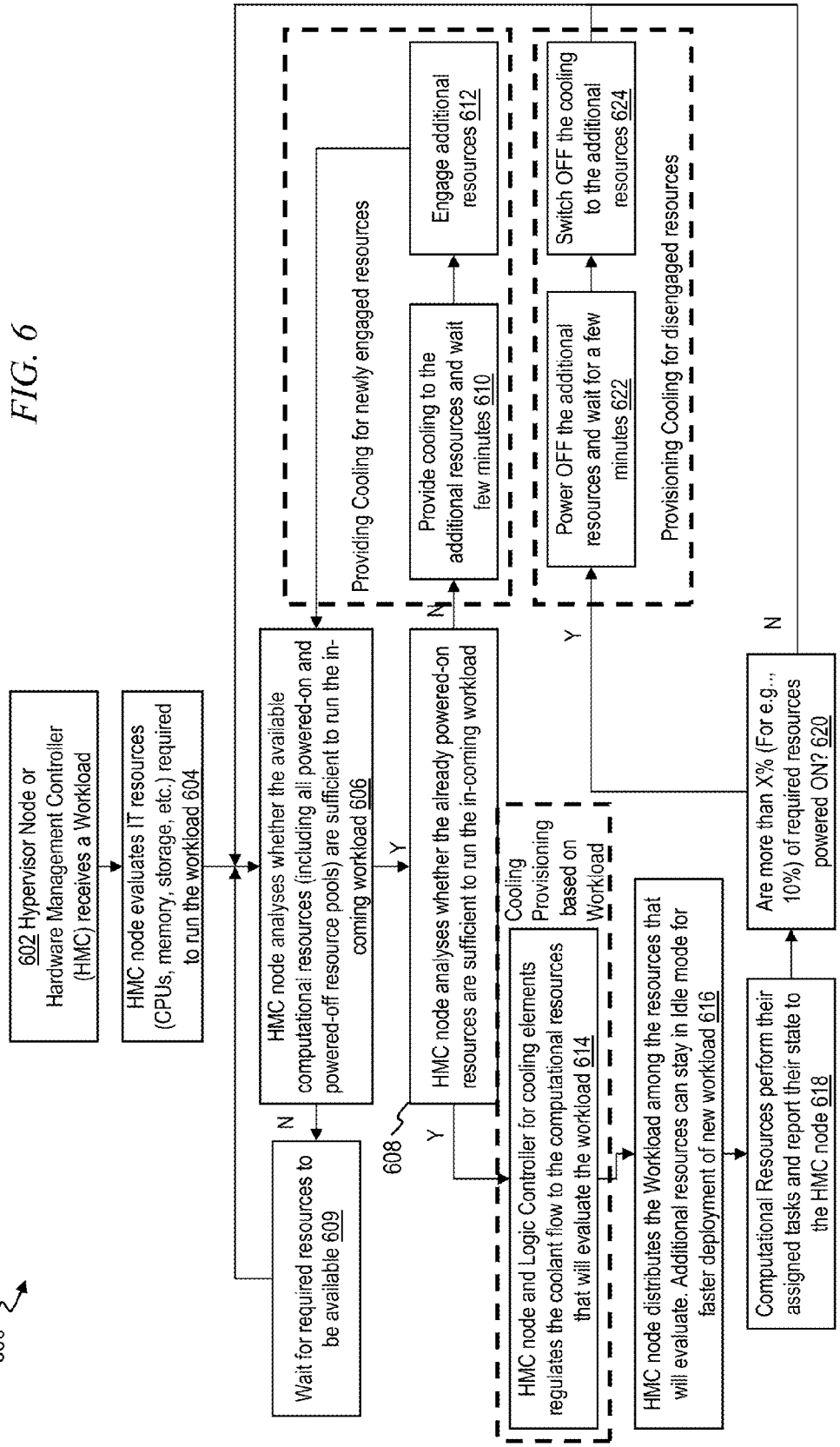
FIG. 6 shows a cooling method for computing system packaging, according to an aspect of the invention.

FIG. 6 shows a sample control method 600 for cooling energy reduction based on computational workload. According to this exemplary control technique, in step 602, a hypervisor or hardware management controller (HMC) node receives a new IT workload. In step 604, the HMC node evaluates the amount of IT resources (such as processors, memory, hard-drive space, etc.) required to run the workload. In step 606, the HMC node checks whether the available computational resources (including all the powered-ON and powered-OFF resource pools) are sufficient to run the in-coming workload. If the available resources are insufficient to evaluate the new workload, as per the "N" branch to step 609, the HMC node holds the new workload in queue and waits for the resources to be available, as seen by the arrow looping back to the beginning of step 606. If there are sufficient resources to run the workload, as per the Y branch, in step 608, the HMC node analyses whether the already powered-on resources are sufficient to run the in-coming workload. If not, as per the N branch, the new workload remains in queue while the additional resources are powered-on. In particular, in step 610, the cooling is switched on for the additional resources and after some wait time, the additional resources are powered-on in step 612 and the control passes on to block 606.

Now, if the powered-on resources are sufficient to run the in-coming workload, as per the Y branch of block 608, the HMC node and the logic controller for cooling elements regulates the cooling to the powered-on resources that will evaluate the workload, in step 614. In step 616, the HMC node distributes the workload among the powered-on resources that will evaluate the workload. If there are any additional resources powered on, they can stay in idle mode for faster deployment of new workload. Assigned resources then perform their assigned tasks and report their state to the HMC node, as seen in step 618. Additional checks can be performed by the HMC node. For example, as in step 620, determine whether a margin of more than X % (for example 10%) of the required resources in each pool are powered on. If so (Y branch), these excess resources can be powered off in step 622. Furthermore in this regard, in one or more embodiments, required resources are turned on plus a small cushion, say 10% more than needed; i.e., 110% of required resources are turned on. In one or more embodiments, if there is more than an X % (e.g., 10%) margin, turn the extras off (i.e., more than 110% of requirements turned on). In one or more embodiments, unlike prior art systems, the cooling system can be provisioned just like the servers themselves (current systems typically run the cooling (air conditioning) continuously, even when servers are in sleep mode.

In one or more embodiments, first the resources are powered-off, and then after a certain wait time, the cooling to those resources is turned off in step 624. If more than X % of the required resources in each pool are not powered on (e.g., 110% or less are powered on), as per the N branch of step 620, program control proceeds to step 606. Also, during the entire process, the HMC keeps track of the state of each of the resources and/or resource pools.

It will be appreciated that step 614 represents cooling provisioning based on workload; steps 610 and 612 represent providing cooling for newly engaged resources; and steps 622, 624 represent provisioning cooling for disengaged resources.

Figure 7A:
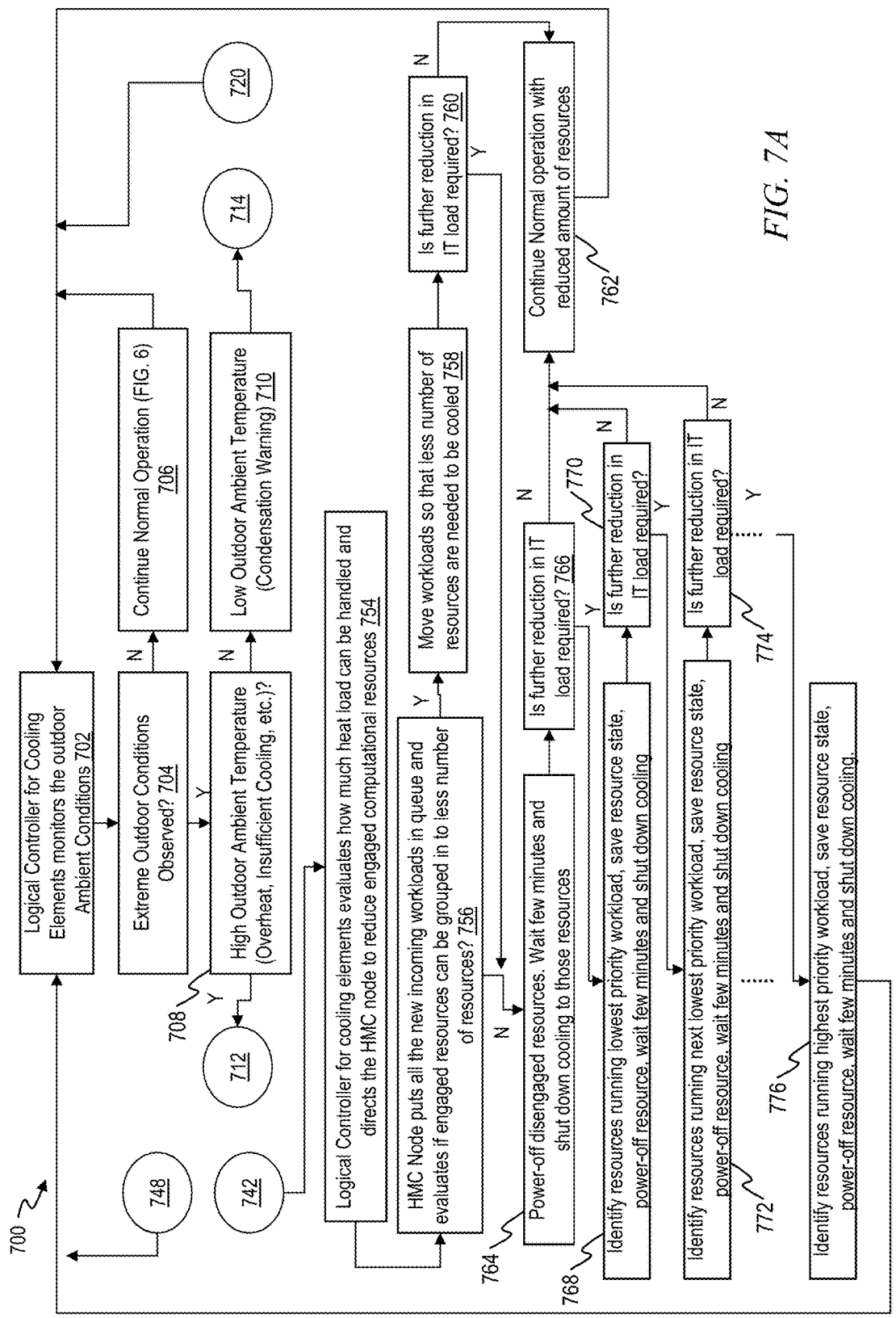
FIGS. 7A-7C show cooling/computational resources control based on outdoor conditions, according to an aspect of the invention.

FIG. 7A shows a sample control method 700 for the control of computational resources and cooling power based on outdoor ambient conditions. In step 702, the logical controller 599 for the cooling elements continuously monitors, along with other parameters, the outdoor ambient conditions. If the outdoor ambient conditions seem normal (N branch of block 704), the system will perform normal operation as described with respect to FIG. 6, as seen in step 706. On the other hand, if extreme outdoor conditions are observed in step 704 (such as very high (>40° C.) or very low (<−10° C.) outdoor ambient temperature), as per the Y branch, in decision block 708 and step 710 the system will determine what kind of extreme condition is present. If it is a high outdoor temperature warning, the control will pass to connector 712 (FIG. 7C). Otherwise, if it is a very low temperature warning, the control will pass to the connector 714 (FIG. 7B).

Figure 7B:
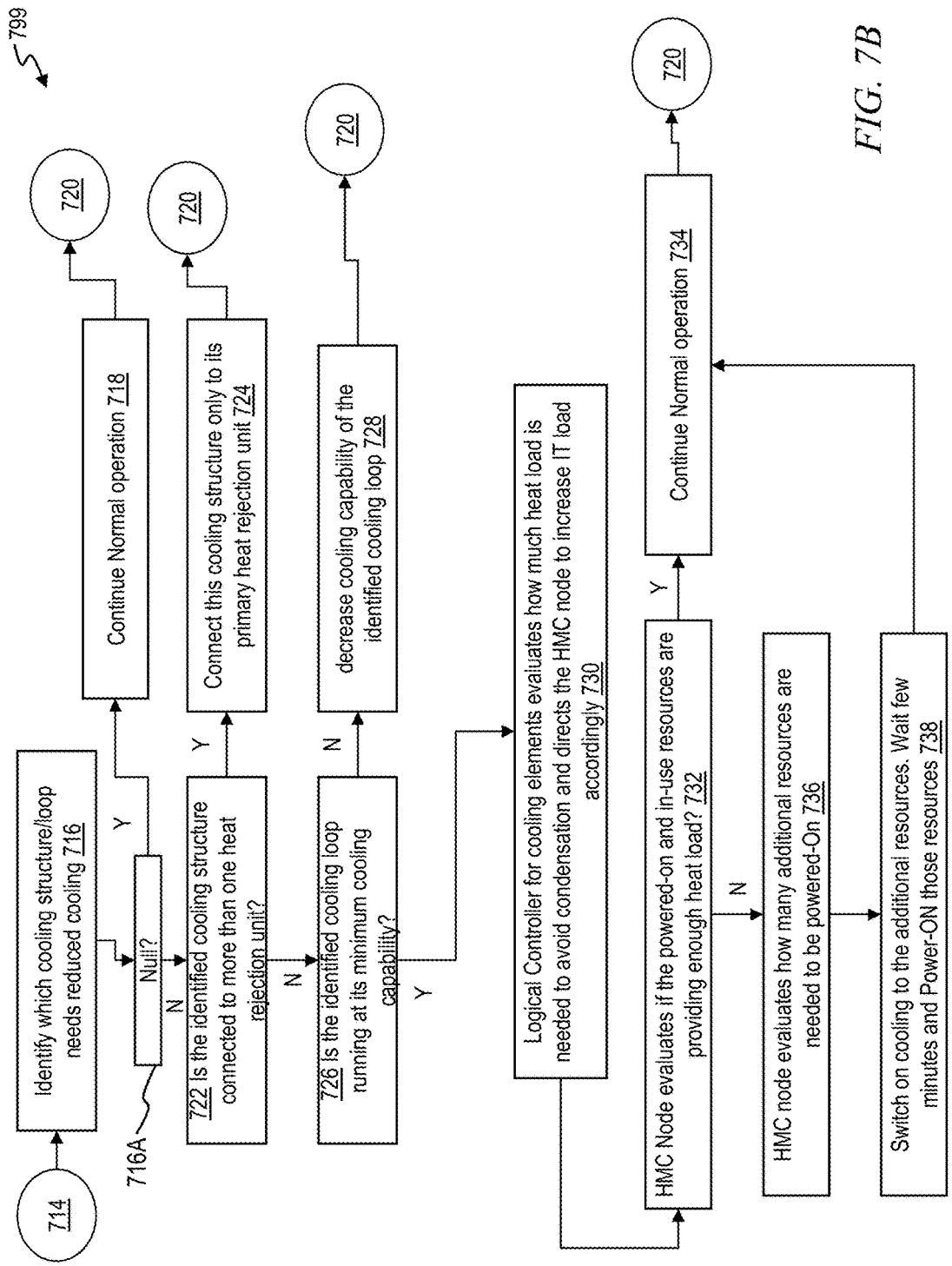
Figure 7C:
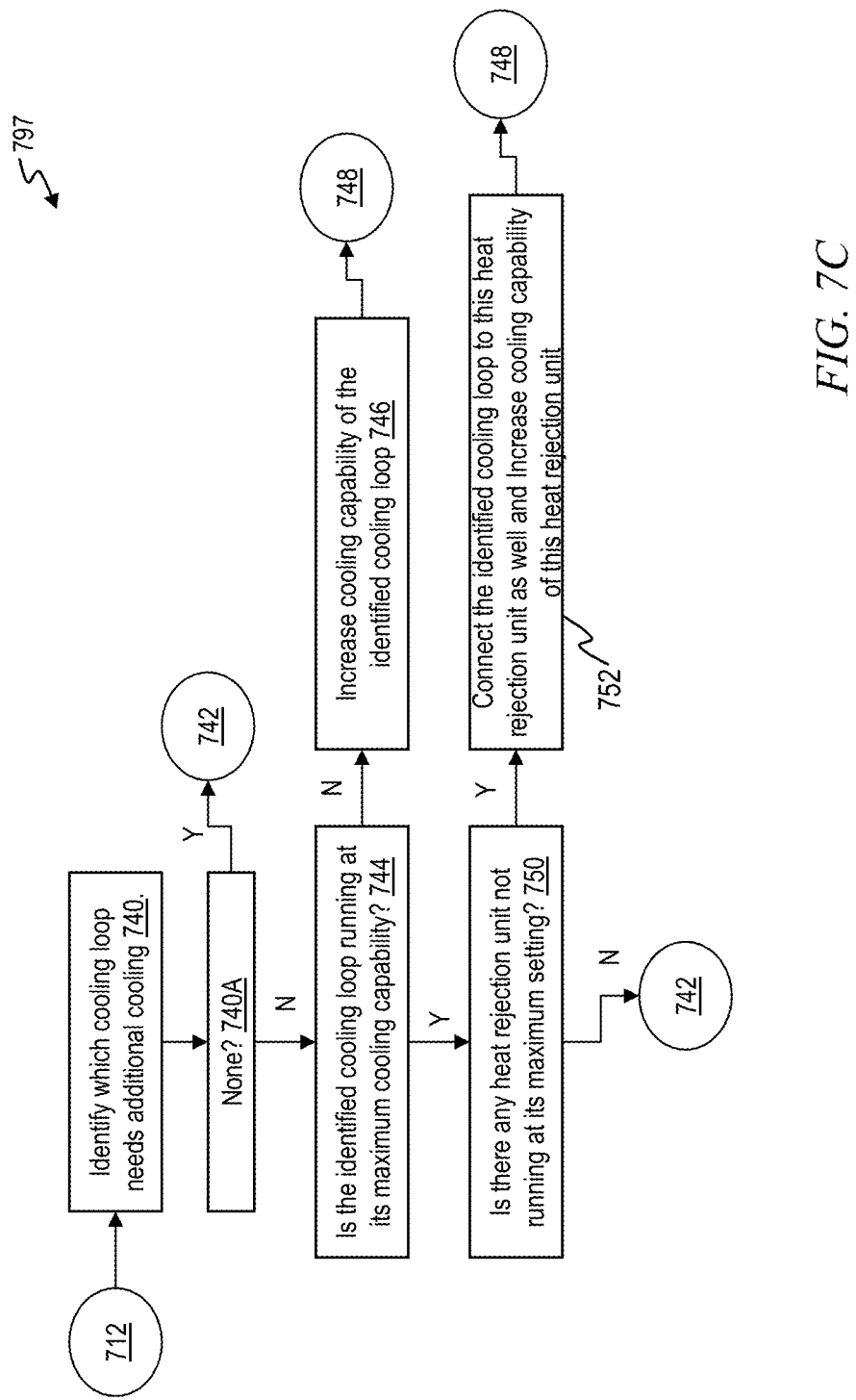

FIG. 7B shows a sample control response 799 to a very low temperature warning case. A pertinent goal here is to increase the temperature of the coolant reaching the servers to avoid condensation and also, in case of a dry cooler type heat rejection unit, to have a sufficient amount of heat in the loop exposed to the outdoor ambient so that the temperature of the coolant in the loop stays well above its freezing point. According to this method, the control comes in from the connector 714 and identifies, in step 716, which cooling structure and/or loop needs reduced cooling. If none of the cooling structures requires reduced cooling (Y branch of null step 716A), the cooling system continues to operate at its current state in step 718, and control passes to location 720 in FIG. 7A. If a cooling structure requires reduced cooling (N branch of null step 716A), it is then checked in step 722 if that identified cooling structure is connected to more than one heat rejection unit. If yes (Y branch), this identified cooling structure is connected only to its corresponding primary heat rejection unit in step 724 and the control passes to location 720 in FIG. 7A. Otherwise (N branch of block 722), it is checked in step 726 whether the identified cooling loop is operating at its minimum cooling capacity. If not (N branch of block 726), the cooling capability of this identified cooling loop is reduced in step 728 and the control passes to location 720 in FIG. 7A.

If the identified cooling system is running at its minimum state (Y branch of block 726) and still the low temperature warning is on, the logical controller 599 for cooling elements evaluates in step 730 how much heat load is needed to avoid condensation and directs the HMC node to increase the IT load accordingly. The HMC node then, in step 732, evaluates whether the powered-on and in-use resources are providing enough heat load. If yes (Y branch of block 732), the system will continue normal operation with modified settings as in step 734 and the control passes to location 720 in FIG. 7A. Otherwise (N branch of block 732), the HMC node will, in step 736, evaluate how many additional resources are needed to be powered on to provide the required heat load. The cooling to those additional resources is switched on in step 738 and then, after a certain wait time, those additional resources are powered on. Normal operation then ensues with the additional resources in operation, as per step 734 and the control passes to location 720 in FIG. 7A. From location 720 in FIG. 7A, control goes to the "extreme conditions" block 702 and if the extreme conditions check of step 704 is negative, the system will continue normal operation (FIG. 6) with the changed settings, as per step 706.

FIG. 7C shows a sample control response 797 to a high temperature warning case. A pertinent goal here is to first try and keep the devices optimally cooled by engaging additional cooling and if that is not possible, reduce the IT heat load by provisioning the IT. According to this method, the control comes-in from the connector 712 and, in step 740, identifies which cooling loop requires additional cooling. If none requires additional cooling (Y branch of none block 740A), the control passes to location 742 in FIG. 7A. If there is a cooling loop that requires additional cooling (N branch of none block 740A), it is checked in step 744 whether the identified cooling loop is running at its maximum cooling capacity. If not (N branch), the cooling capacity of the identified cooling loop is increased in step 746, and the control passes to location 748 in FIG. 7A.

Otherwise (Y branch of block 744), it is checked in step 750 whether there are any other heat rejection unit(s) not running at their maximum setting(s). If yes (Y branch), the identified cooling loop is connected to the first available heat rejection unit in addition to the primary heat rejection unit of the identified cooling structure and the cooling capability of this newly engaged heat rejection unit is increased, in step 752, and the control passes to location 748 in FIG. 7A. Otherwise (N branch), control passes to location 742 in FIG. 7A.

Now continuing at location 742 in FIG. 7A, in step 754, the logical controller 599 for the cooling elements evaluates how much heat load can be handled by the cooling system for the current outdoor ambient conditions and directs the HMC node to provision or reduce the IT load accordingly. In step 756, the HMC node then puts all the in-coming workload in queue and evaluates if the powered-on and in-use resources can be grouped into a smaller number of computational pools. If yes (Y branch), the workloads are moved in step 758 so that a smaller number of resources need to be cooled. Then, it is checked in step 760 whether further reduction in the IT load is required. If not (N branch), the normal system operation continues in step 762 with modified settings and a reduced number of active resources. Otherwise (Y branch of block 760, if further reduction in IT load is required or if the powered on and in-use resources cannot be grouped into a smaller number of racks (N branch of block 756), the resources running in idle-mode are powered off in step 764 and after a certain wait time, the cooling to those resources is also turned off.

Next, it is checked in step 766 whether further reduction in IT load is required. If not (N branch), the normal system operation continues with modified settings and reduced number of active resources, in step 762. If yes (Y branch of block 766), the resources running the lowest priority workload are identified in step 768, their current state saved and then they are powered off. After a certain wait time, the cooling to those resources is also powered-off. Next, it is checked in step 770 whether further reduction in IT load is required. If not (N branch), the normal system operation continues with modified settings and reduced number of active resources, in step 762. If yes (Y branch of block 770), this process continues as long as the extreme conditions warning check is positive or until all the resources (including the ones running highest priority workloads) are powered-off, as indicated at 772, 774, 776 and by the ellipses.

One or more embodiments provide an apparatus for cooling energy use optimization in a computer system. The apparatus pools computer sub-components based on their corresponding heat densities. The apparatus includes a cooling structure for the pool of computer sub-components based on their heat densities. At least one controllable component is associated with the cooling structure, and a controller is included to dynamically adjust the controllable components.

In some instances, the computer sub-components are connected by high speed interconnects. In some embodiments, the high heat density components are liquid cooled and/or the low density components are air cooled.

The cooling structures may transfer heat, for example, to one or more of ambient, refrigeration, or energy reuse apparatus.

One or more embodiments provide a method for optimizing cooling energy use in a computer system including pooling of computer sub-components based on their corresponding heat densities; providing a cooling structure for the pool of computer sub-components based on their heat densities; providing at least one controllable component associated with the cooling structure; providing a controller to dynamically adjust the controllable components; and dynamically adjusting the controllable components to optimize energy use. The controllable components can be adjusted, for example, based on outdoor ambient conditions and/or heat dissipated by each of the pools of computational resources.

It will thus be appreciated that one or more embodiments utilize fabric computing wherein the CPU(s), memory(ies), and disk(s) can be configured in "pools" rather than in close proximity to each other. This provides a path to increasing data center cooling and/or power energy efficiency by providing cooling solutions that can be designed for sub-component power density and/or dynamic configuration that can provide provisioning of cooling and power. Indeed, one or more embodiments pool the hardware based on sub-component power densities and provide dynamic configurability to enable simultaneous provisioning of power and cooling. Again, one or more embodiments utilize new subsystem packaging where CPU, memory, disk can be configured in "pools" rather than close proximity to each other and thus provide a path to increasing data center cooling and/or power energy efficiency.

Given the discussion thus far, it will be appreciated that, in general terms, an exemplary system, according to an aspect of the invention, includes a reconfigurable computing system, which in turn includes a first pool (e.g., 502) of collocated high heat density computing components and a second pool (e.g., 506) of collocated low heat density computing components. Components can be collocated, for example, in a rack or a drawer within a rack. The second pool of components are of a different type than the first pool of components, and are spaced apart from the first pool of components (e.g., in different drawers in the rack, or different racks altogether). The reconfigurable computing system also includes a reconfigurable switching fabric (e.g., 508, 510, 512) electrically interconnecting the first pool of collocated high heat density computing components and the second pool of collocated low heat density computing components.

The exemplary system further includes a first cooling structure (e.g., 514) in thermal communication with the first pool of collocated high heat density computing components, a second cooling structure (e.g., 524) in thermal communication with the second pool of collocated low heat density computing components, and at least one heat rejection unit (e.g., 516, 522, and/or 526) in thermal communication with the first cooling structure, the second cooling structure, and at least one heat sink 518.

The exemplary system still further includes a controller 599 (e.g., PLC interfacing with HMC/Hypervisor as discussed elsewhere herein) coupled to the reconfigurable computing system, the first and second cooling structures, and the at least one heat rejection unit. The controller is configured to obtain a specification of a computing workload and electrically configure at least a portion of the first pool of collocated high heat density computing components and at least a portion of the second pool of collocated low heat density computing components to handle the computing workload, by reconfiguring the switching fabric. The controller is further configured to select operating parameters for the first and second cooling structures and the at least one heat rejection unit to handle the computing workload, and optionally, to control operation of the system in accordance with the parameters, such as by adjusting flow rates and/or valve/damper settings.

In some instances, the controller (e.g., HMC/Hypervisor portion) electrically configures at least a portion of the first pool of collocated high heat density computing components and at least a portion of the second pool of collocated low heat density computing components by activating additional resources from at least one of the first pool of collocated high heat density computing components and the second pool of collocated low heat density computing components; and the controller (e.g., PLC) selects the operating parameters for the first and second cooling structures to provide cooling to the additional resources, prior to the activating of the additional resources.

In some instances, the controller (e.g., HMC/Hypervisor portion) electrically configures at least a portion of the first pool of collocated high heat density computing components and at least a portion of the second pool of collocated low heat density computing components by deactivating excess resources from at least one of the first pool of collocated high heat density computing components and the second pool of collocated low heat density computing components; and the controller (e.g., PLC) selects the operating parameters for the first and second cooling structures by removing cooling from the excess resources, after the deactivating of the excess resources.

As seen in FIGS. 7A and 7B, in some cases, the controller is further configured to sense temperature of the at least one heat sink (e.g., step 702), and, responsive to an abnormally low temperature of the at least one heat sink as at 710, reduce cooling to at least one of the first and second cooling structures, as shown in FIG. 7B.

In one or more embodiments, an abnormally high temperature for ambient outdoor air as a heat sink is greater than 40 Celsius, while an abnormally low temperature for ambient outdoor air as a heat sink is below the dew point; say, less than 5 Celsius in winter, and less than 15 Celsius in summer.

With continued reference to FIGS. 5 and 7B, and especially step 724 of FIG. 7B, in some cases, the at least one heat rejection unit includes a first heat rejection unit 516 in thermal communication with the first cooling structure 514 and the at least one heat sink 518; and a second heat rejection unit 526 in thermal communication with the second cooling structure 524 and at least one heat sink 518. The first cooling structure is selectively thermally connectable to the second heat rejection unit and/or the second cooling structure is selectively thermally connectable to the first heat rejection unit (e.g., via the valve arrangement shown in FIG. 5). The controller is configured to reduce cooling to at least one of the first and second cooling structures by at least one of:

ceasing the selective thermal connection between the first cooling structure and the second heat rejection unit, if the first cooling structure is to receive the reduced cooling; and ceasing the selective thermal connection between the second cooling structure and the first heat rejection unit, if the second cooling structure is to receive the reduced cooling.

Referring now to step 738 of FIG. 7B, in some cases, the controller is further configured to cause increased power dissipation to at least one of the first and second cooling structures, if the reduced cooling is insufficient to prevent at least one of condensation and freezing.

Referring now to FIGS. 7A and 7C, in some cases, the controller is further configured to sense temperature of the at least one heat sink, and, responsive to an abnormally high temperature of the at least one heat sink, increase cooling to at least one of the first and second cooling structures.

Referring now to step 752 of FIG. 7C, in some cases, the at least one heat rejection unit includes a first heat rejection unit 516 in thermal communication with the first cooling structure 514 and the at least one heat sink 518; and a second heat rejection unit 526 in thermal communication with the second cooling structure 524 and at least one heat sink 518. The first cooling structure is selectively thermally connectable to the second heat rejection unit and/or the second cooling structure is selectively thermally connectable to the first heat rejection unit, via the valve arrangement in FIG. 5 or the like. The controller is configured to increase cooling to at least one of the first and second cooling structures by at least one of:

activating the selective thermal connection between the first cooling structure and the second heat rejection unit, if the first cooling structure is to receive the increased cooling; and activating the selective thermal connection between the second cooling structure and the first heat rejection unit, if the second cooling structure is to receive the increased cooling.

In another aspect, a method is provided for thermally controlling a reconfigurable computing system as described herein. The method includes the steps of obtaining a specification of a computing workload; electrically configuring at least a portion of the first pool of collocated high heat density computing components and at least a portion of the second pool of collocated low heat density computing components to handle the computing workload, by reconfiguring the switching fabric; and selecting operating parameters for: the reconfigurable computing system; a first cooling structure in thermal communication with the first pool of collocated high heat density computing components; a second cooling structure in thermal communication with the second pool of collocated low heat density computing components; and at least one heat rejection unit in thermal communication with the first cooling structure, the second cooling structure, and at least one heat sink; to handle the computing workload.

Any of the other steps described herein as carried out by the controller can also be included in embodiments of the method.

Even further, the reconfigurable computing system, the first cooling structure; the second cooling structure; and the at least one heat rejection unit can be operated in in accordance with the operating parameters (for example, under control of a controller 599 including an HMC/hypervisor 805 to control the reconfigurable computer and a PLC 820 to control the thermal components).

Note that the "first" pool and "second" pool are arbitrary; the first pool has higher heat density than the second pool so if the first pool is 502 the second pool could be 504 or 506, and so on.

One or more embodiments of the invention, or elements thereof, can be implemented, at least in part, in the form of an apparatus including a memory and at least one processor that is coupled to the memory and operative to perform exemplary method steps.

One or more embodiments can make use of software running on a general purpose computer or workstation. For example, such software running on a general purpose computer or workstation may include the aforementioned hypervisor or hardware management controller (HMC) which controls the provisioning of the computer resources. Software running on a general purpose computer or workstation may also be used to implement controller 599 which controls provisioning of thermal control resources. In other embodiments, controller 599 is implemented as a programmable logic controller (PLC).

Figure 8:
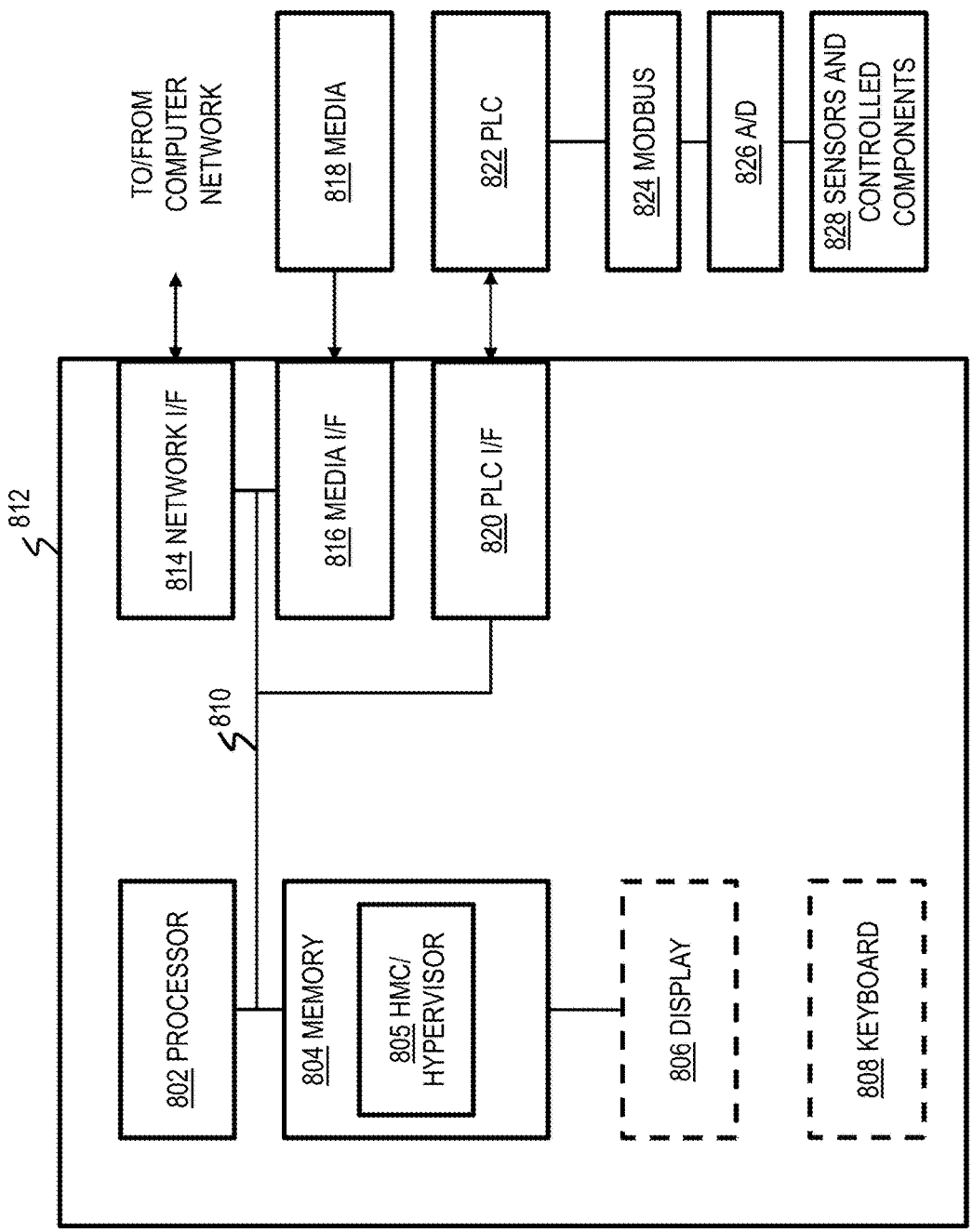
FIG. 8 depicts a computer system that may be useful in implementing one or more aspects and/or elements of the invention.

With reference to FIG. 8, an implementation via software on a general purpose computer might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

In a non-limiting example, the aforementioned hypervisor or hardware management controller (HMC) 805 resides within memory 804 and controls computing resources via network interface 814. A programmable logic controller (PLC) interface 820 is coupled to bus 810 and is provided to interface with programmable logic controller (PLC) 822 which is programmed to function as controller 599 to provision and control the thermal control resources. A suitable network connection is provided between PLC 822 and the components 828 to be controlled or from which input is obtained. The network connection may employ, for example, the well-known Modbus serial communications protocol originally published by Modicon (now Schneider Electric). The skilled artisan will appreciate that Modbus provides a bus structure used to communicate with control elements and sensors. Where appropriate, analog-to-digital converters 826 can be provided if analog sensors or controllers are being used.

In one or more embodiments, controlled elements include pump speed (e.g., rpm), fan speed (e.g., rpm), valve state, and power on/off state of the electrical loads (e.g. servers). In one or more embodiments, sensor inputs include component temperatures (can be measured with thermocouples or the like), flow rate (can be measured with flow meters or the like), outdoor ambient temperature and humidity, chilled water temperature, temperatures at pertinent locations in the fluidic loops (e.g., heat exchanger inlet, heat exchanger inlet outlet, and so on), indoor temperature and humidity (in the data center), leak detector output, and so on. Humidity can be measured with a modern hygrometer.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 802 coupled directly or indirectly to memory elements 804 through a system bus 810. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 812 as shown in FIG. 8) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein. The method steps can then be carried out using the distinct software modules and/or sub-modules of the system, as described above, executing on one or more hardware processors 802 and/or PLC 822. Further, a computer program product can include a computer-readable storage medium with code adapted to be implemented to carry out one or more method steps described herein, including the provision of the system with the distinct software modules. In a non-limiting example, three distinct logical modules or blocks are provided: a sensor-reading component, an output/actuate component, and a control system with logic to implement algorithms and/or leak detection. There is also a data center operating system (e.g., element 805) that allocates workloads. The cooling system control 822 may obtain power dissipation and cooling requirements from the data center operating system. The cooling system control module 599 includes control, sense, and actuate sub-modules. One or more embodiments interface between the cooling center and data center operating systems.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of optimizing cooling energy for a reconfigurable computing system having a first pool of collocated high heat density computing components, a second pool of collocated low heat density computing components of a different type than said first pool of collocated high heat density computing components and spaced apart from said first pool of collocated high heat density computing components, and a reconfigurable switching fabric electrically interconnecting said first pool of collocated high heat density computing components and said second pool of collocated low heat density computing components, said method comprising the steps of:

obtaining a specification of a computing workload;

electrically configuring at least a portion of said first pool of collocated high heat density computing components and at least a portion of said second pool of collocated low heat density computing components to handle said computing workload, by reconfiguring said reconfigurable switching fabric; and selecting operating parameters for:

said reconfigurable computing system;

a first cooling structure in thermal communication with said first pool of collocated high heat density computing components;

a second cooling structure in thermal communication with said second pool of collocated low heat density computing components; and at least one heat rejection unit in thermal communication with said first cooling structure, said second cooling structure, and at least one heat sink, wherein said at least one heat rejection unit comprises:

a first heat rejection unit in thermal communication with said first cooling structure and said at least one heat sink; and a second heat rejection unit in thermal communication with said second cooling structure and at least one heat sink; and said first cooling structure is selectively thermally connectable to said second heat rejection unit and/or said second cooling structure is selectively thermally connectable to said first heat rejection unit; and said method further comprising the additional steps of:
sensing temperature of said at least one heat sink; and
responsive to an abnormally low temperature of said at least one heat sink, reducing cooling to said at least one of said first and second cooling structures by at least one of:
ceasing said selective thermal connection between said first cooling structure and said second heat rejection unit, if said first cooling structure is to receive said reduced cooling; and
ceasing said selective thermal connection between said second cooling structure and said first heat rejection unit, if said second cooling structure is to receive said reduced cooling.

2. The method of claim 1, further comprising causing increased power dissipation to at least one of said first and second cooling structures, if said reduced cooling is insufficient to prevent at least one of condensation and freezing.

3. A method of optimizing cooling energy for a reconfigurable computing system having a first pool of collocated high heat density computing components, a second pool of collocated low heat density computing components of a different type than said first pool of collocated high heat density computing components and spaced apart from said first pool of collocated high heat density computing components, and a reconfigurable switching fabric electrically interconnecting said first pool of collocated high heat density computing components and said second pool of collocated low heat density computing components, said method comprising the steps of:
obtaining a specification of a computing workload;
electrically configuring at least a portion of said first pool of collocated high heat density computing components and at least a portion of said second pool of collocated low heat density computing components to handle said computing workload, by reconfiguring said reconfigurable switching fabric; and
selecting operating parameters for:
said reconfigurable computing system;
a first cooling structure in thermal communication with said first pool of collocated high heat density computing components;
a second cooling structure in thermal communication with said second pool of collocated low heat density computing components; and
at least one heat rejection unit in thermal communication with said first cooling structure,
said second cooling structure, and at least one heat sink, wherein:
said at least one heat rejection unit comprises:
a first heat rejection unit in thermal communication with said first cooling structure and said at least one heat sink; and
a second heat rejection unit in thermal communication with said second cooling structure and at least one heat sink; and
said first cooling structure is selectively thermally connectable to said second heat rejection unit and/or said second cooling structure is selectively thermally connectable to said first heat rejection unit; and
said method further comprising the additional steps of:
sensing temperature of said at least one heat sink; and
responsive to an abnormally high temperature of said at least one heat sink, increasing cooling to said at least one of said first and second cooling structures by at least one of:
activating said selective thermal connection between said first cooling structure and said second heat rejection unit, if said first cooling structure is to receive said increased cooling; and
activating said selective thermal connection between said second cooling structure and said first heat rejection unit, if said second cooling structure is to receive said increased cooling.

* * * * *